United States Patent [19]

Chiang et al.

[11] Patent Number: 4,598,305

[45] Date of Patent: Jul. 1, 1986

[54] DEPLETION MODE THIN FILM SEMICONDUCTOR PHOTODETECTORS

[75] Inventors: Anne Chiang, Cupertino; Noble M. Johnson, Menlo Park, both of Calif.

[73] Assignee: Xerox Corporation, Stamford, Conn.

[21] Appl. No.: 621,340

[22] Filed: Jun. 18, 1984

[51] Int. Cl.$^4$ .................... H01L 29/78; H01L 27/12
[52] U.S. Cl. ........................ 357/23.7; 357/4; 357/23.14; 357/24; 357/30
[58] Field of Search ............ 357/23.7, 4, 23.14, 357/24 LR, 30, 24

[56] References Cited

U.S. PATENT DOCUMENTS

| | | | |
|---|---|---|---|
| 3,704,376 | 11/1972 | Lehovic | 357/23.7 |
| 3,735,156 | 5/1973 | Krambeck | 357/24 |
| 4,065,781 | 12/1977 | Gutknecht | 357/23.7 |
| 4,330,363 | 5/1982 | Biegelsen et al. | 156/620 |
| 4,409,724 | 10/1983 | Tasch, Jr. et al. | 29/571 |
| 4,419,696 | 12/1983 | Hamano et al. | 358/294 |

OTHER PUBLICATIONS

A. Chiang et al., "NMOS Logic Circuits in Laser Crystallized Silicon on Quartz", Energy Beam–Solid Interactions & Transient Thermal Processing, MRS Proceedings, vol. 23, pp. 551–558 (Elsevier, 1984).

N. M. Johnson et al., "Processing & Properties of CW Laser-Recrystallized Silicon Films on Amorphous Substrates", Laser & Electron Beam Solid Interactions & Materials Processing, MRS Proceedings, vol. 1, pp. 463–470 (Elsevier, 1981).

Fennell et al., "Defect Reduction by Titled Zone Crystallization of Patterned Silicon Films on Fused Silica", Energy Beam–Solid Interactions & Transient Thermal Processing, MRS Proceedings, vol. 23, pp. 403–408 (Elsevier, 1984).

Primary Examiner—Martin H. Edlow
Attorney, Agent, or Firm—W. Douglas Carothers, Jr.

[57] ABSTRACT

A depletion mode thin film semiconductor photodetector comprises a crystalline silicon thin film on an insulating substrate with a source region, a drain region and a thin film light sensing channel region formed therebetween. A gate oxide formed over the channel region and a gate electrode formed on the gate oxide. A p-n junction located parallel to the surface of the substrate and within the thin film functioning as a space charge separation region in the channel. The lower portion of the channel region is a p region extending to the substrate and the upper portion of the channel region is a n region extending to the gate oxide. The channel region functions as a fully depleted channel when the photodetector is operated in its OFF state providing for high dynamic range and large photocurrent operation. The depletion mode thin film semiconductor photodetector with n+ source and drain regions function as an ohmic contacts to the channel n region forming a thin film transistor. The thin film transistor photodetector has high photoconductive gain at low light intensities when the n channel region is fully pinched off by an applied gate voltage to the gate electrode which is sufficiently negative as compared to the threshold voltage of the photodetector. When the drain region is replaced by a p+ region functioning as an ohmic contact to the channel p region, a depletion mode gated diode is formed. When the channel region is extended to include a plurality of linearly spaced gate electrodes formed on the gate oxide region with an input diode formed adjacent to the first of such gate electrodes and an output diode formed adjacent to the last of such gate electrodes, the photodetector functions as a charge coupled device.

30 Claims, 9 Drawing Figures

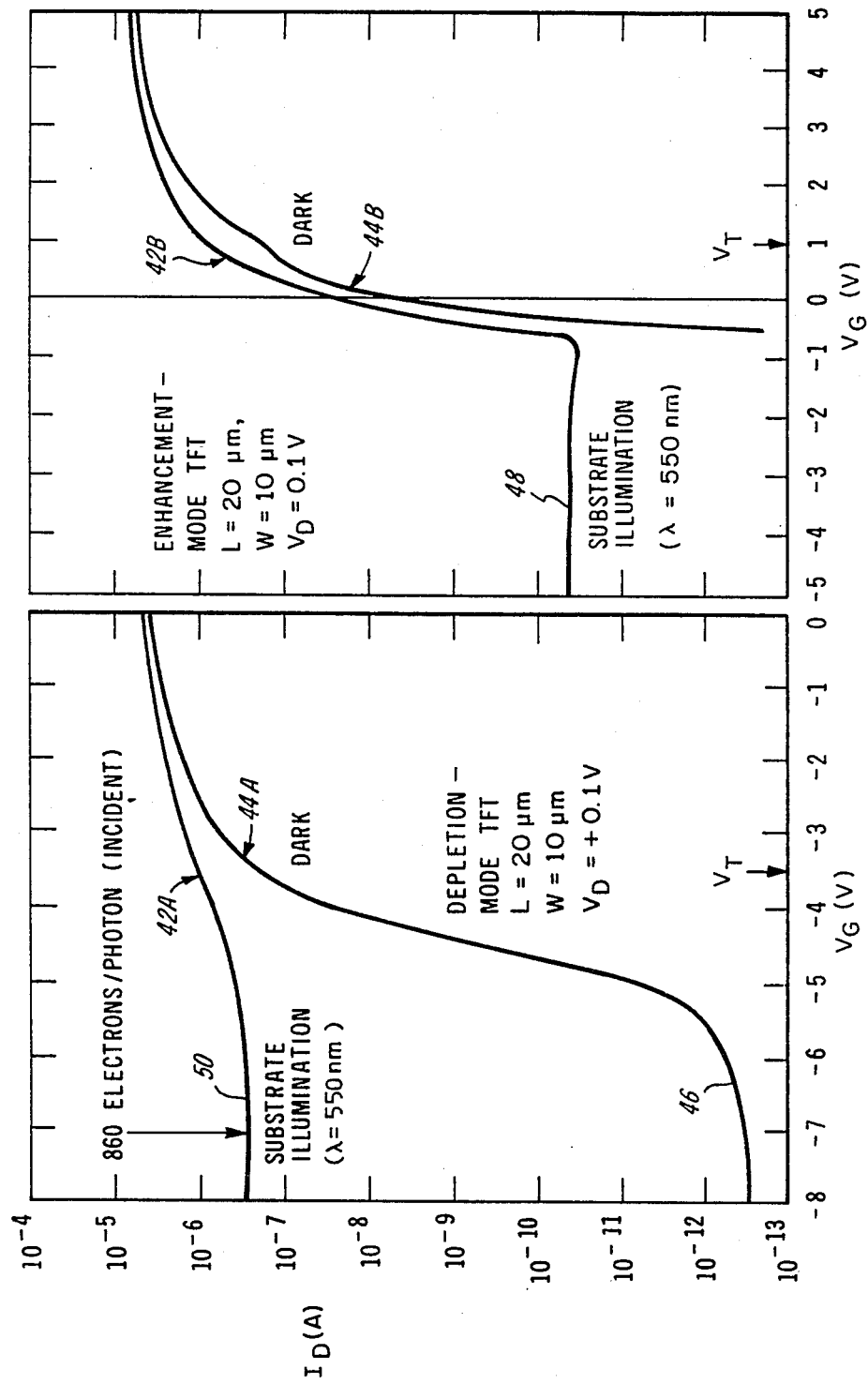

DEPLETION MODE THIN FILM SEMICONDUCTOR PHOTODETECTORS

BACKGROUND OF THE INVENTION

This invention relates to semiconductor photodetector devices and more particularly to depletion mode thin film semiconductor photodetectors, e.g., thin film transistors (TFT's) or photodiodes, especially suited for use in large area image sensor arrays.

Because of its ease of disposition on transparent substrates over a large area and ease to obtain reproducible transistor operations, crystallized silicon TFT's show great potential in applications including large area displays, photodetectors, image sensors and integrated optics devices.

Because of its photosensitivity, silicon has been employed in photosensors in the configurations of photodiodes, phototransistors and charge-coupled devices. Ordinarily, these configurations are fabricated on bulk single-crystalline silicon substrates. The overall size of such configurations is limited by the size of the silicon wafer. The use of light collection optics for reading a large image area requires a bulky sensing system.

Because of the ease of deposition of amorphous silicon (a-Si:H) thin films on transparent substrates of arbitrarily large size, these thin films have been employed in large area image sensor arrays for contact document input scanners. See, for example, U.S. Pat. No. 4,419,696. However, because of the low carrier mobilities in a-Si:H, the photosensitivity and the speed are, in general, found to be poorer than compared to sensors fabricated in bulk crystalline silicon (c-Si).

Recent progress in laser crystallization have enabled formation of defect free, single crystalline silicon thin films on bulk amorphous substrates for formation of high performance TFT's to permit applications to direct view large area electronic devices such as flat panel displays and image sensors on transparent substrates. See for example, U.S. Pat. No. 4,409,724. Recent demonstration of TFT shift registers also promises to broaden the field of application from local switching of individual transducers to include logic circuits having sufficiently high speed for data rates often encountered in image processing. See, for example, A. Chiang et al., in "NMOS Logic Circuits in Laser Crystallized Silicon on Quartz", Proceedings of the 1983 Materials Research Society, Boston, Mass., November, 1983, and published in the book, *Energy Beam-Solid Interactions & Transient Thermal Processing*, John C. C. Fann and N. M. Johnson, editors Vol. 23, pp. 551-558 (Elsevier, N.Y., 1984).

Crystallization of silicon thin films on insulating substrates, e.g., fused quartz, in patterned and encapsulated configuration by a scanned CW laser have been well documented in the art. See, for example, U.S. Pat. No. 4,330,363 and the book, *Laser & Electron-Beam Solid Interactions & Materials Processing*, J. F. Gibbons et al, editors, Vol. 1, in particular the article of N. M. Johnson et al at pages 463-470 entitled "Processing and Properties of CW Laser-Recrystallized Silicon Films on Amorphous Substrates" (Elsevier, N.Y., 1981). The recent technological breakthrough involves using a solidification front tilted from the path of the molten zone of the scanned CW laser. Structural defects can be greatly reduced or even eliminated by a lateral defect-sinking thus permitting formation of very high percentage of (100)-textured single crystalline silicon islands with <100> in-plane orientations. See the Proceedings of the 1983 Materials Research Society Meeting, supra and L. Fennell et al., "Defect Reduction by Titled Zone Crystallization of Patterned Silicon Films on Fused Silica, both soon to be published in the book, *Energy Beam-Solid Interactions & Transient Thermal Processing*, John C. C. Fann and N. M. Johnson, editors Vol. 23, pp. 403-408 (Elsevier, N.Y., 1984).

These advances in the technology of laser crystallized silicon thin films on insulating substrates have produced numerous novel NMOS and CMOS thin film electronic devices with performances comparable or superior to that of bulk devices. However, the photosensitivity demonstrated in enhancement mode TFT's has not been sufficiently great to provide a desired level of S/N ratio and dynamic range for contact input scanner applications such as high speed, high resolution in compact electronic copiers or printers or facsimile machines.

SUMMARY OF THE INVENTION

According to this invention, a depletion mode thin film semiconductor photodetector has pronounced photosensitivity compared to comparable enhancement mode thin film transistors or amorphous silicon photodiodes, such as three or more orders of magnitude improved photoconductive gain in depletion mode thin film TFT photodetectors of this invention over the photosensitivity of such prior devices.

The depletion mode semiconductor photodetector of this invention comprises a crystal silicon thin film on an insulating substrate with source, drain and channel regions. A p-n junction located parallel to the surface of the substrate is within the thin film and functions as a space charge separation region in the film for photogenerated carriers. The lower portion of thin film comprises a p region functioning as a storage zone for holes while the upper portion of the thin film comprises an n region functioning as a current channel between the source and drain region of the photodetector by forming a storage zone or potential well for electrons. The TFT photodetector of this invention, with n+ source and drain regions function as an ohmic contacts to the channel n region, exhibits high photoconductive gain with low background signal and even at low light intensities when the device is operated with a fully depleted channel by a reverse biased gate, i.e., when the n channel region is fully pinched off by an applied gate voltage to the gate electrode which is sufficiently negative as compared on the threshold voltage of the photodetector.

When the drain region is replaced by a p+ region functioning as an ohmic contact to the channel p region, a depletion mode gated diode is formed.

When the channel region is extended to include a plurality of linearly spaced gate electrodes formed on the gate oxide region with an input diode formed adjacent to the first of such gate electrodes and an ouput diode formed adjacent to the last of such gate electrodes, the photodetector functions as a charge coupled device.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 2 is a graphic illustration of the drain current versus gate voltage characteristics for both light and dark conditions for a depletion mode TFT photodetector of FIG. 1 (FIG. 2A) and for an enhancement mode TFT photodetector under corresponding illuminating and operating conditions (FIG. 2B).

DETAILED DESCRIPTION OF THE PREFERRED EMBODIMENT

Figure 1:
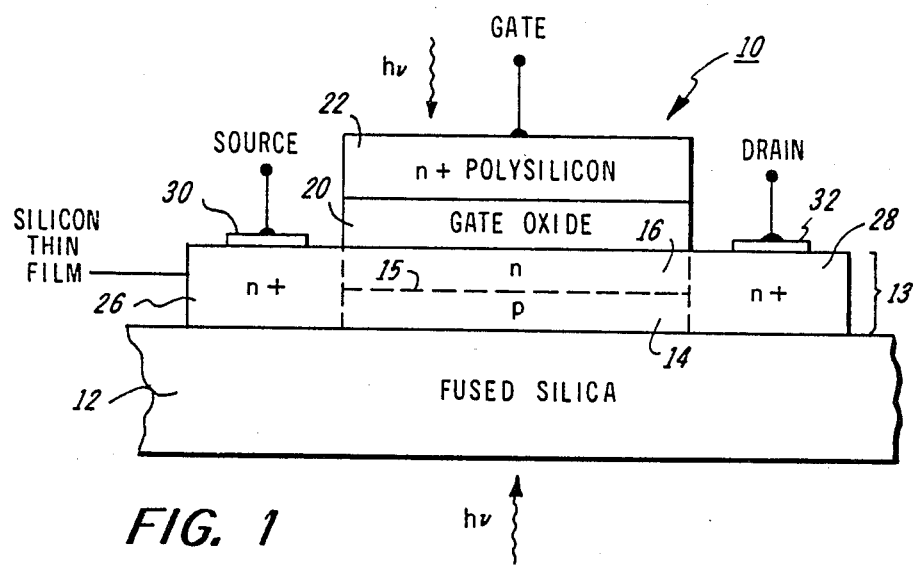
FIG. 1 is a cross sectional illustration of a depletion mode TFT photodetector of this invention.

Referring now to FIG. 1, there is shown the thin film depletion mode TFT photodetector 10 of this invention. Photodetector 10 comprises a buried channel thin film transistor on a transparent and insulating substrate 12, such as fused quartz. Substrate 12 can be of other insulating material such as glass or ceramic plates. The transparency of substrate 12 is useful for sensing light at the transistor through the substrate, although fabrication also permits transmission of light through the polysilicon gate electrode 22 of the transistor. In any case, substrate 12 may be chosen to be transparent or nontransparent depending upon the desired design for light transmission to an integrated semiconductor array including transistor photodetectors 10 of this invention.

Transistor photodetector 10 comprises a crystallized Si thin film layer 13 which is patterned by photolithography into a discrete island. Layer 13 may be, for example, be 0.5 $\mu$m thick. The range of thickness for layer 13, and correspondingly the channel region 11 formed by regions 14 and 16, may be in the range, for example, of about 0.3 $\mu$m to 50 $\mu$m. It is doped by conventional techniques (e.g., ion implantation) to form a lower half p type region 14 (e.g. boron) and an upper half n type region 16 (e.g., phosphorus) forming a p-n junction 15. Gate oxide layer 20 is thermally grown by oxidizing the n layer 16 followed by depositing n+ polysilicon layer 22 comprising the gate electrode. Gate oxide layer 20 may, for example, be about 0.13 $\mu$m thick and polysilicon gate 22 may be about 0.35 $\mu$m thick. The source and drain regions 26 and 28 are formed on opposite sides of the channel region 14 and 16 by As+ implantation to form highly doped n+ regions functioning as ohmic contacts to channel 16. Source electrode 30 and the drain electrode 32 may be comprised of vapor deposited Al.

Transistor photodetector 10 may be formed by fabrication techniques known in the art. For example a 0.5 $\mu$m thick layer of LP-CVD polysilicon on a fused quartz wafer may be patterned by photolithography and plasma etching to provide a plurality of islands which are then subjected to a laser melting treatment to bring about recrystallization. Laser crystallization is accomplished with a scanned CW $CO_2$ laser spot which is offset from the center of the islands to generate a tilted solidification front which it is scanned across each of the islands. This technique produces predominantly (100)-textured, and <100>-oriented crystal silicon islands without sub-grain boundaries. After laser crystallization, fabrication of the TFT's may be carried out, for example, with an NMOS process with six mask levels as described in the previous paragraph and in A. Chiang et al, Proceedings of SPIE Symposium on Laser Processing of Semiconductor Devices Vol. 385, 76 (1983), and in the book *Energy Beam—Solid Interactions & Transient Thermal Processing, supra.*

The p-layer 14 in the depletion mode TFT photodetector 10 of FIG. 1 is formed by implantation of boron ions through the gate oxide prior to deposition of the polygate electrode 22 to give an acceptor concentration of about $10^{17}/cm^3$ in the lower region 14 of layer 13. Similarly, the n layer 16 is formed by implantation of phosphorus ions to achieve a donor concentration of comparable density in the upper region 16 of layer 13. The acceptor and donor concentration may be in the range of $10^{16}/cm^3$ to $10^{18}/cm^3$.

For comparison of photosensitivities, enhancement mode TFT's are fabricated with a nearly identical process. The only exception in the fabrication process is the replacement of the n layer 16 with a lightly doped p layer by implantation of boron ions to obtain a donor concentration of $2 \times 10^{16}/cm^3$ in the upper half of the channel region, i.e., region 16.

The photosensitivity of a depletion mode and an enhancement mode TFT of identical geometry are compared in FIGS. 2A and 2B. The drain current for each device illuminated with 400 $\mu$W/cm$^2$ green light through the substrate, $I_{D,\,photo}$, represented by curves 42A (depletion mode TFT) and 42B (enhancement mode TFT), is plotted versus gate voltage $V_G$ at a drain voltage $V_D = 0.1$ V along with a plot for the drain current in the dark, $I_{D,\,dark}$, represented by curves 44A (depletion mode TFT) and 44B (enhancement mode TFT).

For $V_G >> V_T$ (threshold voltage), the TFT photodetector devices are in the ON state, conducting dark current of a few $\mu$A's. Upon illumination, both devices exhibit enhanced conductivity with a net increase of drain current $\Delta I_D = I_{D,\,photo} - I_{D,\,dark}$ of about one $\mu$A, which is only a small fraction of $I_{D,\,dark}$. Because of the high level of background dark current, TFT's in the ON state would not be useful as photodetectors even though the operational photoconductive gain, G, is quite high, (about 2650 electrons/incident photon for either type of TFT device). Photoconductive gain, G, is defined as the number of photogenerated electrons transiting the channel region 16 for each incident photon.

For $V_G << V_T$, the TFT photodetector devices are in the OFF state. $I_{D,\,dark}$ is negligibly small, almost $10^{-13}$ A for the depletion mode device, as noted at 46, and about $10^{-15}$ A for the enhancement mode device. Upon illumination, the enhancement mode device shows a rather insignificant photocurrent of 40 pA at 48. In contrast, the depletion mode device shows a marked increase in conductivity exhibiting a photocurrent of 324 nA at 50, which is about $10^4$ times higher than that of the enhancement mode device. This high photocurrent corresponds to an operational gain of 860 electons/incident photon. With a view of the results of FIG. 2A, the large photocurrent attribute as well as a small dark current attribute of the depletion mode TFT photodetector 10 in the OFF state offers a most desirable operation as a photodetector.

The silicon island forming photodetector 10 is about 0.5 μm thick and absorbs only 25% of the incident light, the fundamental photoconductive gain, G, may be as large as 3440 electrons/absorbed photon, if reflection is ignored and unity quantum efficiency is assumed. Such a large gain in an n type photodetector with ohmic contacts implies a very long electron lifetime which can be estimated from an alternate definition for photoconductive gain, G set forth in equation (1).

$$G = \tau/t_n \qquad (1)$$

where $\tau$ is equal to the liftime of photoelectron before recombination with a hole, and $t_n$ is equal to the transit tine of an electron in channel region 16 and is determined by equation (2).

$$t_n = L^2/\mu_n V_D \qquad (2)$$

where L is equal to the channel length, $\mu_n$ is equal to the electron mobility, and $V_D$ is equal to voltage applied across channel.

For L equal to 20 μm, $V_D$ equal to 0.5 V, $\mu_n$ equal to approximately 1500 cm²/Vs, and G equal to 3440 electrons/absorbed photon, $t_n$ is 5.3 ns and $\tau$ would be 18 μs. This prediction is further supported by actual transient measurements which give a 10% photocurrent relaxation time of 10 μs after termination of a steady-state illumination.

Figure 3:
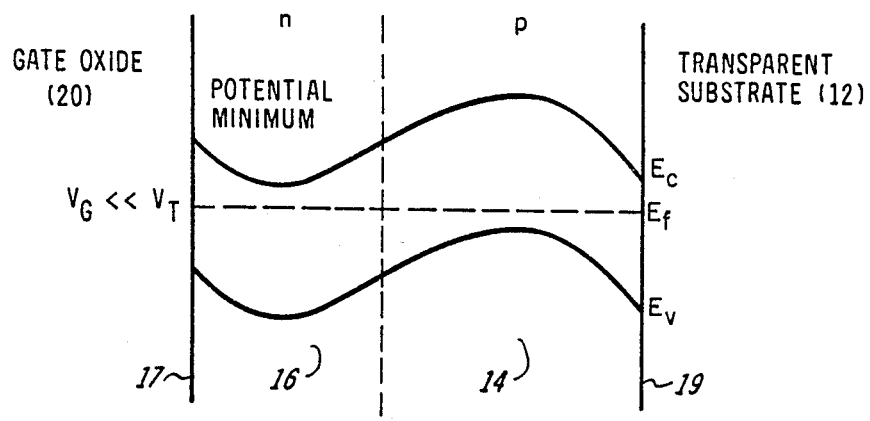
FIG. 3 is an energy band diagram for the depletion mode TFT photodetector of FIG. 1.

The physics of the depletion mode TFT photodetector 10 can be qualitatively explained with the aid of an energy band diagram of the channel region 14 and 16 shown in FIG. 3. The solid lines $E_C$ and $E_V$, respectively, represent the conduction and valence bands while the dotted line, $E_f$, is the Fermi level. The metallurgical junction 15 in the silicon thin film layer 13 is located about 0.2 μm beneath the gate oxide/Si interface 17 with depletion region extending approximately 0.1 μm from either side of the p-n junction 15. A large and negative $V_G < < V_T$ applied to the gate electrode depletes the top surface layer of the n-type region 16 of the channel to the extent that the n-region is fully pinched off with no free carriers in the channel, so that the dark current is negligible.

The gate bias-induced depletion layer and the junction depletion layer in the n-region 16 merges to form a potential minimum about 0.1 μm beneath the Si/SiO₂ interface. Similarly, a potential maximum also exist in the pregion 14 because of the depletion by a positive fixed oxide charge in the substrate characteristic of silicon devices fabricated on SiO₂ substrates. Photogenerated electron/hole pairs are separated by diffusion and drift across the p-n junction. Electrons are collected in a buried conducting channel defined by the potential minimum in the n layer and holes are collected in the potential maximum in the p layer 0.2 μm away from this minimum.

Under constant illumination, this charge separation reaches a steady-state condition with each type of carrier making a distinct contribution to photoconductivity. Holes remain in the floating p layer as space charge while electrons in the buried channel contribute to photocurrent until they recombine with holes across the p-n junction and to a much smaller extent at the top or bottom interfaces 17 and 19. As the electrons are electrostatically confined in the buried channel away from the holes in the p layer and from the Si/SiO₂ interfaces which generally have more defects than the bulk, the recombination process is greatly inhibited. Consequently, the photoelectrons effectively contribute to the photocurrent for times exceeding the transit time of the channel, giving rise to a photoconductive gain G, as defined in equation (1), much greater than unity.

Thus the major contributing factors for such high level of photosensitivity in the depletion mode TFT photodetector of this invention are:

(1) formation of p-n junction 15 for charge separation with the fabrication of a p layer or region 14 underneath the n channel 16, and formation of a buried channel for photoconduction with a reverse biased gate to avoid surface recombination, (2) excellent quality of single crystalline thin films achieved in this particular manner of crystallization, leaving little defects or grain boundaries in the bulk of the thin film to serve as recombination centers, and (3) higher electron mobility for a buried channel as compared to that for a surface channel.

This photoconductive gain of several 1000's electrons/absorbed photon in depletion mode TFT of this invention is much superior to that in phototransistors of the art that characteristically have a G of approximately 100. To compare with thin film photodetectors known in the art and fabricated of other material or structure, the $\mu_n \tau$ product, which indicates the distance travelled by a photocarrier under a field of 1 V/cm, is used as the figure of merit. This product may be also calculated according to equation (3) which is derived from equations (1) and (2)

$$\mu_n \tau = GL^2/V \qquad (3)$$

With a $\mu_n \tau$ product value of $10^{-1}$ to $10^{-2}$ cm²/V, the depletion mode TFT is also a much more sensitive photodetector than any other thin film photodetectors thus far reported or known in the art. For example, the $\mu \tau$ product is about $10^{-6}$ cm²/V for laser crystallized large grain polysilicon TFT's, $10^{-4}$ to $10^{-7}$ cm²/V for CdS photoconductive films, $10^{-3}$ to $10^{-4}$ cm²/V for IR sensing PbS TFT's, and $10^{-6}$ cm²/V for a-Si:H photodiodes.

In terms of photodetector performance, the depletion mode TFT photodetector 10 referred to in FIGS. 1 and 2, with only a 0.5 μm thick silicon film 13 to absorb 10% in the red, 25% in the green and 60% in the violet, can be operated with appreciable photosensitivity throughout the visible range and with nearly linear low light level responses.

Figure 4:
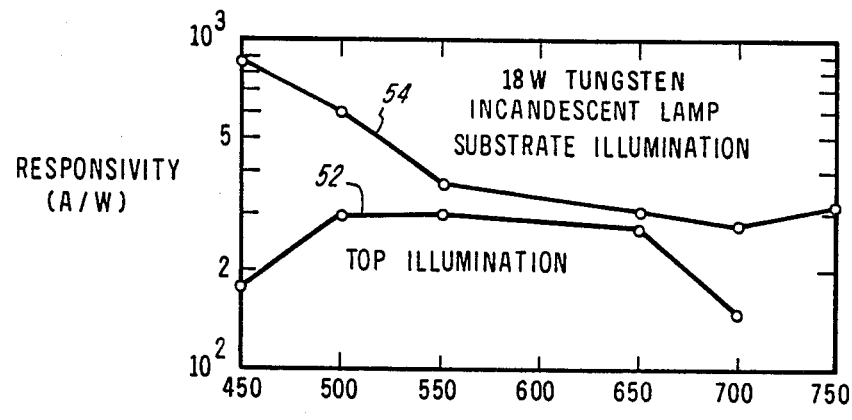
FIG. 4 is a graphic illustration of the linear dependence of photo current on incident power at low light levels in the depletion mode TFT photodetector illuminated by a GaAs diode laser.

FIG. 4 shows the spectral photoresponsivity, defined as the ratio of photocurrent to incident power, for TFT photodetector 10. For illumination through the polysilicon gate 22 with an 18 W tungsten incandescent lamp, responsivity illustrated by curve 52 is in the range of about 200-300 Amp/Watt incident power and it is to be noted that photodetector 10 is nearly panchromatic in the visible range. For illumination through the transparent substrate 12, illustrated by curve 54, the responsivity is correspondingly higher because the "incident" power is comparatively higher. Again to be noted is that photodetector 10 is nearly panchromatic in the visible range.

Figure 5:
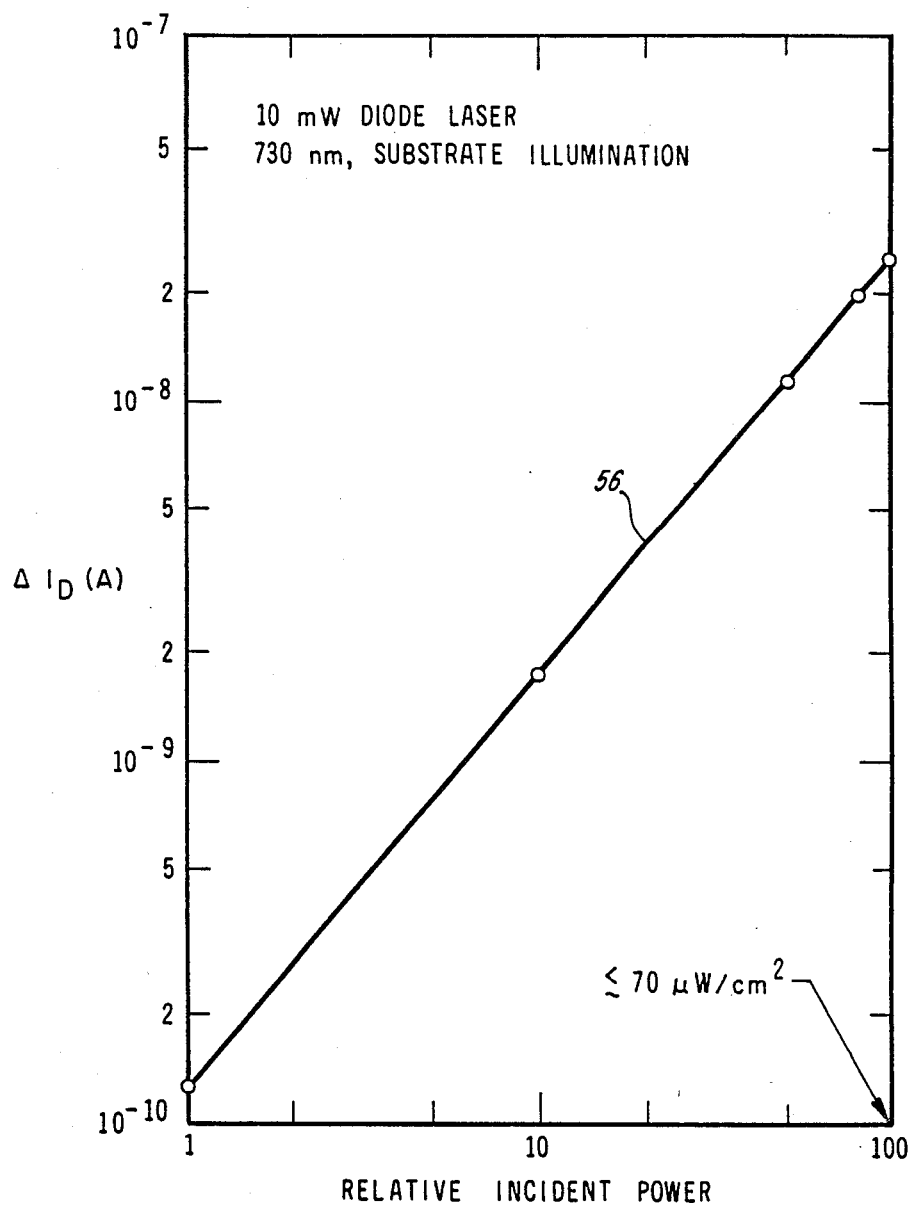
FIG. 5 is a graphic illustration of the spectral dependence of photoresponsivity of the depletion mode TFT photodetector illuminated through the polysilicon gate and through the substrate.

In FIG. 5, photocurrent change relative to illuminated incident power level is disclosed. Curve 56 is linear and shows a linear dependence on incident power down to about 1 $\mu W/cm^2$, which is indicative of the low light level photosensitivity of TFT photodetector 10.

Further optimization of the device geometry and doping conditions should lead to even more desirable photodetector operations in terms of large photocurrent, low noise, wide dynamic range, and customized spectral sensitivity. High speed (10 $\mu s$/line), high resolution (10 $\mu m$ channel width, or up to 2500 lines/in contact imaging) page-wide document input scanner should be achievable.

If even higher speed is desired, a tradeoff between photoconductive gain and detection speed can be obtained in such high gain depletion mode photodetectors without too much sacrifice in photosensitivity. This can be achieved by varying dopant concentrations to change the p-n junction barrier height and thereby altering the generation recombination process and lifetime of the photocarriers.

Figure 6:
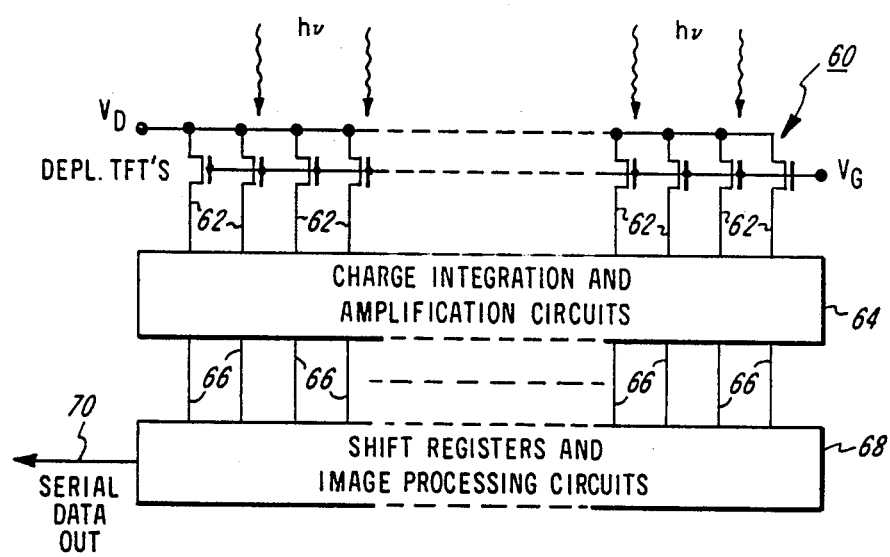
FIG. 6 is a diagrammatic illustration of an exemplary use of the depletion mode TFT photodetector of this invention.

As the depletion mode TFT is a standard component of NMOS logic circuitry, a large area image sensor array with its own charge integration, amplification and logic circuits may be fabricated with an NMOS process developed for laser crystallized TFT's with little differences or modifications. FIG. 6 depicts an application for TFT photodetector 10 in a large area image sensor array 60 wherein the drain region outputs 62 are supplied to charge integration and amplification circuits 64 where the signals on lines 62 are integrated over time and amplified. The amplified signal is provided via lines 66 to a series of shift registers and image processing circuits 68 where the signals are buffered and image processed for serial output on line 70.

The principle of buried channel photoconduction in thin film devices to avoid surface recombination and lengthen photocarrier lifetime is applicable to other device configurations to make viable thin film photodetectors on large substrates with photosensitivities that are at least comparable to, if not better than, that found in their counterparts fabricated in the bulk silicon substrate.

Figure 7:
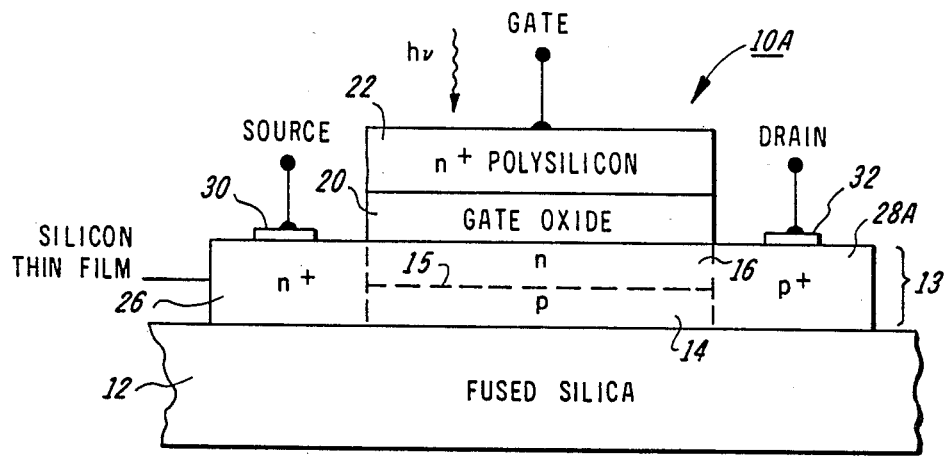
FIG. 7 is a cross sectional illustration of a depletion mode gated photodiode of this invention.

For example, FIG. 7 discloses the photodiode version of the semiconductor photodetector of this invention. Photodiode 10A is essentially the same in construction as TFT photodetector 10 of FIG. 1 except drain region 28 is replaced by a highly doped p+ region 28A functioning as an ohmic contact to p region 14. The depletion mode buried channel thin film gated diode 10A may be employed as a photodetector with close to unity gain but much higher operating speeds, such as in the range of nanosecond response, compared to its TFT photodetector 10 counterpart in FIG. 1. Diode 10A provides a charge separation mechanism for a negative biased photodiode wherein photogenerated carriers can be separated and collected in reverse biased conditions in the buried channels in both the p and n regions 14 and 16 with high efficiency. Amplification of the output at terminal region 28A of diode 10A can be carried out with an integrated TFT circuit fabricated with NMOS or CMOS process with the same thin film structure as shown in FIG. 1 immediately adjacent to the diode terminal region 28A.

Figure 8:
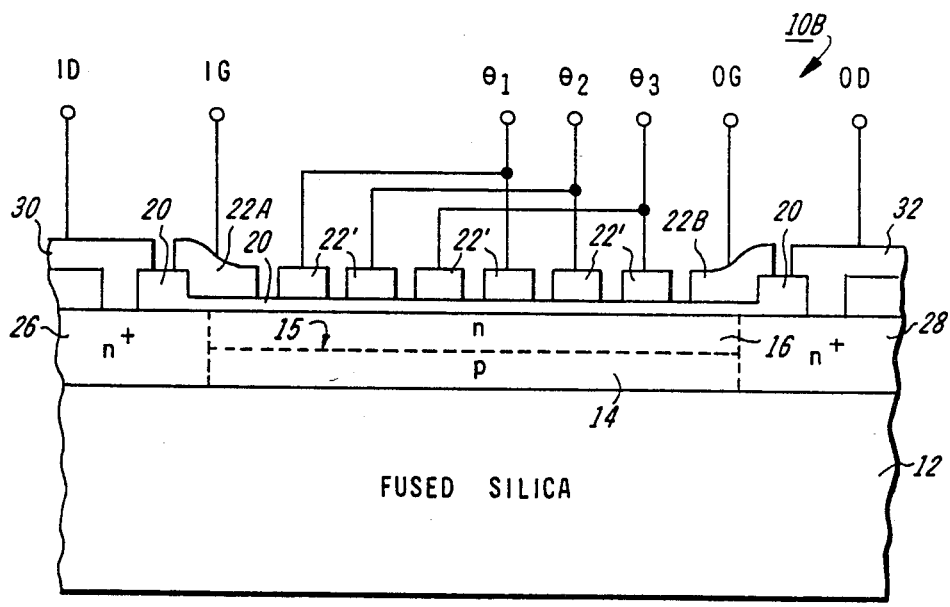
FIG. 8 is a cross sectional illustration of a depletion mode buried channel charge coupled device of this invention.

For another example, FIG. 8 discloses a thin film buried channel charge coupled device (CCD) 10B fabricated with essentially the same process as the depletion mode TFT photodetector 10 except the channel region between the input diode (ID) 30 (equivalent to source) and the output diode (OD) 32 (equivalent to drain) can be as long as several inches, and the gate electrode 22 is segmented into many individual gate electrodes 22' each defining an image sensing site. The first gate electrode 22A is the input gate (IG) and the last gate electrode 22B is the output gate (OG) of CCD 10B. This device may be operated like a buried channel CCD photodetector built in bulk silicon with expected and comparable performance but with comparably higher operating speeds. Again, the realization of thin film CCD 10B permits the integration of the photodetector array with various readout capabilities, for example, with other electronics over large area substrates.

While the invention has been described in conjunction with a few specific embodiments, it is evident to those skilled in the art that many alternatives, modifications and variations will be apparent in light of the foregoing description. For example, reverse polarity of the dopants for photoconduction with holes can be accomplished by doping regions 26 and 28 as p+ and lower region 14 with n and upper region 16 with p. Accordingly, the invention is intended to embrace all such alternatives, modifications and variations as fall within the spirit and scope of the appended claims.

What is claimed is:

1. A depletion mode thin film semiconductor photodetector comprising a crystalline silicon thin film on an insulating substrate with a source region, a drain region and a thin film light sensing channel region formed therebetween, a gate oxide formed over said channel region, a gate electrode formed on said gate oxide, a p-n junction located parallel to the surface of said substrate and within said thin film and creating a space charge separation region therein, the lower portion of said channel region being a first conductivity type region extending to said substrate and the upper portion of said channel region being a second conductivity type region extending to said gate oxide, said source and drain regions functioning as ohmic contacts with said upper portion channel region, said upper portion channel region forming a channel for majority carrier conduction, said lower portion channel region being maintained at floating potential for minority carrier collection as space charge therein, said channel region functioning as a fully depleted channel when said photodetector is operated in its OFF state providing for high dynamic range and large photocurrent operation.

2. The depletion mode thin film photodetector of claim 1 wherein said photodetector comprises n+ source and drain regions functioning as ohmic contacts to said channel n region forming a thin film transistor, said photodetector having high photoconductive gain at low light intensities when said n channel region is fully pinched off by an applied gate voltage to said gate electrode sufficiently negative as compared to the threshold voltage of said photodetector.

3. The depletion mode thin film semiconductor photodetector of claim 1 wherein said lower portion channel region is doped n type and said upper portion channel region is doped p type.

4. The depletion mode thin film semiconductor photodetector of claim 3 wherein said photodetector comprises p+ source and drain regions functioning as ohmic contacts to said channel p region forming a thin film transistor, said photodetector having high photoconductive gain at low light intensities when said p channel region is fully pinched off by an applied gate voltage to said gate electrode sufficiently positive as compared to the threshold voltage of said photodetector.

5. The depletion mode thin film semiconductor photodetector of claim 1 wherein said gate region is semi-transparent.

6. The depletion mode thin film semiconductor photodetector of claim 1 wherein said insulating substrate is transparent.

7. The depletion mode thin film semiconductor photodetector of claim 1 wherein the acceptor and donor concentrations and profiles are chosen to permit photoconduction in said channel region with said channel region fully depleted in the dark.

8. The depletion mode thin film semiconductor photodetector of claim 7 wherein the acceptor and donor concentrations respectively in said channel p region and said channel n region are in the range from $10^{16}/cm^3$ to $10^{18}/cm^3$.

9. The depletion mode thin film semiconductor photodetector of claim 1 wherein the thickness of said channel region is in the range of 0.3 μm to 50 μm.

10. The depletion mode thin film semiconductor photodetector of claim 1 formed by laser melting treatment to bring about recrystallization of said thin film.

11. The depletion mode thin film semiconductor photodetector of claim 1 wherein said channel region is extended to include a plurality of linearly spaced gate electrodes formed on said gate oxide forming a plurality of spaced photodetectors, an input diode formed over said source region and adjacent to the first of said gate electrodes, an output diode formed over said drain region adjacent to the last of said gate electrodes, said photodetectors functioning as a charge coupled device.

12. The charge coupled device of claim 11 wherein said gate region is semi-transparent.

13. The charge coupled device of claim 11 wherein said insulating substrate is transparent.

14. The charge coupled device of claim 11 wherein the acceptor and donor concentrations and profiles are chosen to permit photoconduction in said channel region with said channel region fully depleted in the dark.

15. The charge coupled device of claim 14 wherein the acceptor and donor concentrations respectively in said channel p region and said channel n region are in the range from $10^{16}/cm^3$ to $10^{18}/cm^3$.

16. The charge coupled device of claim 11 wherein the thickness of said channel region is in the range of 0.3 μm to 50 μm.

17. The charge coupled device of claim 11 formed by laser melting treatment to bring about recrystallization of said thin film.

18. The charge coupled device of claim 11 wherein said lower portion channel region is doped n type and said upper portion channel region is doped p type.

19. The charge coupled device of claim 17 wherein said source and drain regions comprise p+ regions functioning as an ohmic contacts to said channel n region.

20. A depletion mode thin film semiconductor photodetector comprising a crystalline silicon thin film on an insulating substrate with a pair of terminal regions and a thin film light sensing channel region formed therebetween, a gate oxide formed over said channel region, a gate electrode formed on said gate oxide, a p-n junction located parallel to the surface of said substrate and within said thin film and functioning as a space charge separation region therein, the lower portion of said channel region being a p region extending to said substrate and the upper portion of said channel region being an n region extending to said gate oxide, one of said terminal regions functioning as an ohmic contact to said channel n region and the other of said terminal regions functioning as an ohmic contact to said channel p region, said channel region functioning as a fully depleted channel when said photodetector is operated in its OFF state providing for high dynamic range and large photocurrent operation, said photodetector forming a depletion mode gated diode.

21. The depletion mode thin film semiconductor photodetector of claim 20 wherein said one terminal region is a n+ region and the other terminal region is a p+ region.

22. The depletion mode thin film semiconductor photodetector of claim 20 wherein said lower portion channel region is doped n type and said upper portion channel region is doped p type.

23. The depletion mode thin film semiconductor photodetector of claim 22 wherein said photodetector comprises p+ terminal regions functioning as an ohmic contacts to said channel p region forming a thin film transistor, said photodetector having high photoconductive gain at low light intensities when said p channel region is fully pinched off by an applied gate voltage to said gate electrode sufficiently positive as compared to the threshold voltage of said photodetector.

24. The depletion mode thin film semiconductor photodetector of claim 20 wherein said gate region is semi-transparent.

25. The depletion mode thin film semiconductor photodetector of claim 20 wherein said insulating substrate is transparent.

26. The depletion mode thin film semiconductor photodetector of claim 20 wherein the acceptor and donor concentrations and profiles are chosen to permit photoconduction in said channel region with said channel region fully depleted in the dark.

27. The depletion mode thin film semiconductor photodetector of claim 26 wherein the acceptor and donor concentrations respectively in said channel p region and said channel n region are in the range from $10^{16}/cm^3$ to $10^{18}/cm^3$.

28. The depletion mode thin film semiconductor photodetector of claim 20 wherein the thickness of said channel region is in the range of 0.3 μm to 50 μm.

29. The depletion mode thin film semiconductor photodetector of claim 20 formed by laser melting treatment to bring about recrystallization of said thin film.

30. The depletion mode thin film semiconductor photodetector of claim 1 wherein said lower portion channel region is doped p type and said upper portion channel region is doped n type.

* * * * *